United States Patent
Nishimura

(10) Patent No.: US 6,459,639 B2
(45) Date of Patent: Oct. 1, 2002

(54) SEMICONDUCTOR MEMORY DEVICE

(75) Inventor: Koichi Nishimura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/773,013

(22) Filed: Jan. 31, 2001

(30) Foreign Application Priority Data

Feb. 8, 2000 (JP) ........................................ 2000-030912

(51) Int. Cl.$^7$ ................................................. G11C 7/00
(52) U.S. Cl. ........................ 365/207; 365/63; 365/206
(58) Field of Search ............................. 365/185.33, 207, 365/189.01, 189.04, 210, 230.03, 205, 206, 63

(56) References Cited

U.S. PATENT DOCUMENTS 5,774,408 A * 6/1998 Shirley ................. 365/230.03
5,822,251 A * 10/1998 Bruce et al. ............. 365/185.33
5,822,262 A * 10/1998 Hashimoto et al. ......... 365/207
6,067,270 A * 5/2000 Hwang .................. 365/230.03

FOREIGN PATENT DOCUMENTS

WO    WO 98/56004    12/1998

* cited by examiner

Primary Examiner—Son T. Dinh
(74) Attorney, Agent, or Firm—Arent, Fox, Kintner, Plotkin & Kahn, PLLC

(57) ABSTRACT

Sense amplifiers provided in a same bank are divided into groups, the sense amplifiers in each group are connected to a common power supply wiring for the sense amplifier which is independent by the group, and the power supply wiring for the sense amplifier of each group is connected to a power supply circuit which is independent so that the ratio of the activated sense amplifiers to the driven power supply circuits is equalized in a reading-out/writing-in operation in which at least one sub-block in the bank is activated and a refreshing operation in which the sub-blocks are concurrently activated, which makes it possible to prevent an insufficiency/excess of a driving capacity of overdrive, without providing a special controlling circuit separately.

12 Claims, 8 Drawing Sheets

SEMICONDUCTOR MEMORY DEVICE

CROSS-REFERENCE TO RELATED APPLICATIONS

This application is based upon and claims priority of Japanese Patent Application No. 2000-030912, filed on Feb. 8, 2000, the contents being incorporated herein by reference.

BACKGROUND OF THE INVENTION

1. Field of the Invention

The present invention relates to semiconductor memory devices, in particular, having a function of switching over power supplies to be used, for example, memories such as DRAMs (Dynamic Random Access Memories) including overdrive sense amplifiers.

2. Description of the Related Art

Recently, in a semiconductor memory device represented by a DRAM or the like which enlarges its capacity, a memory device increases its level of integration year after year, and the reduction of an element such as a transistor progresses year after year. Accordingly, a voltage which can be applied to a memory cell part is decreasing year after year from the viewpoints of less energy consumption and reliability.

However, a sense amplifier which amplifies a fine electric charge outputted from a memory cell of the DRAM decreases its driving capacity with the less voltage and hence the time for amplifying a bit line voltage is lengthened. This results in longer cycle time and access time of the DRAM. Therefore, an overdrive type sense amplifier is proposed in order to reduce the voltage which is applied to the memory cell part and to amplify the bit line voltage quickly by the sense amplifier.

FIG. 5A to FIG. 5E are illustrations showing partial structural examples and operations of the overdrive type sense amplifier in general. FIG. 5A is a circuit diagram showing one sense amplifier part taken from the sense amplifiers which are provided corresponding to memory cell arrays which are in a matrix state and comprise the DRAM.

As shown in FIG. 5A, the sense amplifier is connected to a bit line pair BL and /BL in a flip-flop structure. The drain of a transistor which comprises a not-shown memory cell is further connected to the bit line pair BL and /BL. The sense amplifier amplifies a differential voltage which occurs in the bit line pair BL and /BL according to an electric charge accumulated in a capacitance element of the memory cell which is accessed in reading-out of data.

At this time, the sense amplifier is activated by a signal lex which is supplied from a signal line connected commonly to high potential side terminals of the flip-flops and a signal lez which is supplied from a signal line connected commonly to low potential side terminals of the flip-flops. Namely, as shown in FIG. 5B and FIG. 5C, the signal lex changes to the low level while the signal lez changes to the high level, and the sense amplifier begins to be activated when these reach a certain level.

As shown in FIG. 5B, in driving the sense amplifier of the overdrive type sense amplifier, an external voltage (peripheral voltage) Vdd which has a higher level than an internal step-down voltage (core voltage) Viic as a voltage accumulated in the memory is supplied first as a power supply voltage Viid. Then, after a transitional overdrive time tovd, the power supply voltage Viid to be supplied is decreased to the internal step-down voltage Viic which is in the level of the voltage accumulated in the memory.

The change of its voltage levels of the bit line pair BL and /BL is shown in FIG. 5C. As shown in FIG. 5C, the voltage levels of the bit line pair BL and /BL become sharply disparate, and the bit line voltage is amplified in a short time. Thus, the bit line pair BL and /BL are driven in an early step of the drive by using the external voltage Vdd which has the higher level than the internal step-down voltage Viic, which makes it possible to shorten the time for amplifying the bit lines.

Incidentally, in an appropriate situation as shown in FIG. 5C, the voltage of the bit line pair BL and/BL is precharged to the voltage of the one-half level of the internal step-down voltage Viic after the amplification.

The overdrive time tovd is decided by a method of a fixed delay element according to a value obtained by a simulation or the like in designing the memory, and by a method of sensing its situation by separately providing a dummy sense amplifier for monitoring. (An application in relation to the latter method has been already filed with the Japanese Patent Office in the name of the present applicant.) In each of the methods, it is not the case that the overdrive time tovd is decided by sensing an electric charge of the actual bit line itself.

Moreover, there arises a need for a quick random access of the DRAM in recent years so that an FCRAM (Fast Cycle RAM) is developed as an example of the device for satisfying the need. The basic technology of this FCRAM is disclosed in WO 98/56004. The FCRAM, one memory block of which is further divided into sub-blocks, is a device which processes a narrower operation area of the sense amplifier by activating the sub-block which is selected by a row address only in the reading-out/writing-in of data, and precharges automatically when the processing completes.

FIG. 6 is a diagram showing a structural example when the overdrive type sense amplifier is applied to the FCRAM, which shows one memory block (bank).

In FIG. 6, a row decoder 1 decodes a row address signal and activates a word line to which the memory cell to be accessed is connected among the word lines (not shown) provided on each of the rows of the respective memory cell arrays (sub-blocks) 3 which are arranged in a matrix state.

A column decoder 2 decodes a column address signal, selects the bit line pair to which the memory cell to be accessed is connected among the bit line pair (not shown) provided on each of the columns of the respective memory cell arrays (sub-blocks) 3 which are arranged in a matrix state, and connects the selected bit line pair to a not-shown data-bus.

The sense amplifiers 4 amplify the differential voltage which occurs in the bit line pair according to the electric charge accumulated in the capacitance elements of the memory cells which are accessed in reading-out of data. The sense amplifiers 4 are arranged on each side of the memory cell arrays (sub-blocks) 3 which are arranged in a matrix state in one bank. Power supply wirings for the sense amplifiers (Viid) 5 are the wirings for supplying the power supply voltage to the respective sense amplifiers 4, which are connected in a mesh state to the memory cell arrays (sub-blocks) 3 and the sense amplifiers 4 which are arranged in a matrix state.

Power supply circuits PS1 to PS4 which supply overdrive power supplies are dispersed corresponding to the memory blocks, each of which includes pMOS (pchannel MOS) transistors $6_{-1}$ to $6_{-4}$, $7_{-1}$ to $7_{-4}$ for switching the power supplies. One pMOS transistors $6_{-1}$ to $6_{-4}$ are connected between the power supply wirings for the sense amplifiers (Viid) 5 and the power supplies of the external voltage Vdd, while the other pMOS transistors $7_{-1}$ to $7_{-4}$ are connected between the power supply wirings for the sense amplifiers (Viid) 5 and the power supplies of the internal step-down voltage Viic. These pMOS transistors $6_{-1}$ to $6_{-4}$, $7_{-1}$ to $7_{-4}$ comprise a drive circuit of the sense amplifier 4.

A Viid control circuit 8 controls the turning on/off of the pMOS transistors $6_{-1}$ to $6_{-4}$, $7_{-1}$ to $7_{-4}$ provided in each of the power supply circuits PS1 to PS4. When driving the sense amplifier 4 by turning on/off the pMOS transistors $6_{-1}$ to $6_{-4}$, $7_{-1}$ to $7_{-4}$, this Viid control circuit 8 supplies the external voltage Vdd which has the higher level than the internal step-down voltage Viic to the power supply wirings for the sense amplifiers (Viid) 5 by first turning on the pMOS transistors $6_{-1}$ to $6_{-4}$ on one hand concurrently.

Then, after a transitional overdrive time tovd, the pMOS transistors $6_{-1}$ to $6_{-4}$ on one hand are turned off and the pMOS transistors $7_{-1}$ to $7_{-4}$ on the other hand are turned on concurrently, whereby the internal step-down voltage Viic is supplied to the power supply wirings for the sense amplifiers (Viid) 5. Thus, overdrive of the sense amplifier 4 is operated and the quick amplification of the bit line voltage can be achieved.

FIG. 7 and FIG. 8 are diagrams comparing the numbers of sub-blocks (shown by hatching) which are activated by the reading-out/writing-in operations and the refreshing operation of the FCRAM. As shown in FIG. 7, in reading-out/writing-in of data, only one selected sub-block 3 and the sense amplifiers 4 on both sides thereof are activated. Meanwhile, as shown in FIG. 8, in refreshing, sub-blocks 3 (four sub-blocks 3 which are in a row selected by the row decoder 1) and the sense amplifiers 4 on these both sides are activated in order to reduce the number of the refreshing.

However, in the conventional overdrive type sense amplifier, all the four power supply circuits PS1 to PS4 which drive the sense amplifiers 4 operate concurrently to supply voltage and its operations are the same in the reading-out/writing-in of data and in the refreshing. Therefore, a load which is imposed by each power supply circuit PS1 to PS4 on the sense amplifier 4 in the activated area is different between the reading-out/writing-in of data and the refreshing.

Namely, in the reading-out/writing-in of data as shown in FIG. 7, the loads from the four power supply circuits PS1 to PS4 are imposed concentratedly on one activated area, whereas in the refreshing as shown in FIG. 8, the loads from the four power supply circuits PS1 to PS4 are imposed dispersively on the four activated areas.

Here, if the overdrive time tovd is designed according to, for example, the refreshing time, the driving capacity to the sense amplifiers becomes excessive in the reading-out/writing-in of data, which results in the situation as shown in FIG. 5D. In this situation, too much voltage is applied to the bit line pair BL and /BL to decrease its reliability thereby. Further, shorts of the bit line pair BL and /BL are caused and the precharge level rises than usual in precharging, which causes a problem that the reading-out of data from another memory cell is affected in the following operation of the reading-out of data.

Meanwhile, if the overdrive time tovd is designed according to the reading-out/writing-in of data, the driving capacity to the sense amplifiers becomes insufficient in the refreshing, which results in the situation as shown in FIG. 5E. In this situation, the amplification of the bit line voltage is delayed, which causes a problem that the normal reading-out of data cannot be operated.

To solve the aforesaid problems, it is possible to think about controlling the overdrive time tovd to be different between the reading-out/writing-in of data and the refreshing so that the appropriate load is imposed in each case of the reading-out/writing-in of data and the refreshing. However, this kind of processing is complex and it is necessary to provide the control circuit like this separately, which causes to complicate the circuit structure.

SUMMARY OF THE INVENTION

It is an object of the present invention to realize appropriate overdrive of a sense amplifier of an activated area in each case of a reading-out/writing-in of data and a refreshing, without complicating a circuit structure.

In a semiconductor memory device according to the present invention, the sense amplifiers which are provided in a same bank are divided into groups, the sense amplifiers in each group are connected to a common power supply line which is independent by the group, and the power supply line of each group is connected to a power supply circuit which is independent.

Thereby, the ratio of the activated sense amplifiers to the driven power supply circuits can be equalized between a first operation mode in which at least one sense amplifier is activated in the bank and a second operation mode in which the increased number of sense amplifiers are activated in the bank than in the first operation mode, which makes it possible to equalize the loads of the sense amplifiers between the first operation mode and the second operation mode, when seen from the respective power supply circuits.

DETAILED DESCRIPTION OF THE PREFERRED EMBODIMENTS

Hereinafter, a preferred embodiment of the present invention will be described with reference to drawings.

Figure 1:
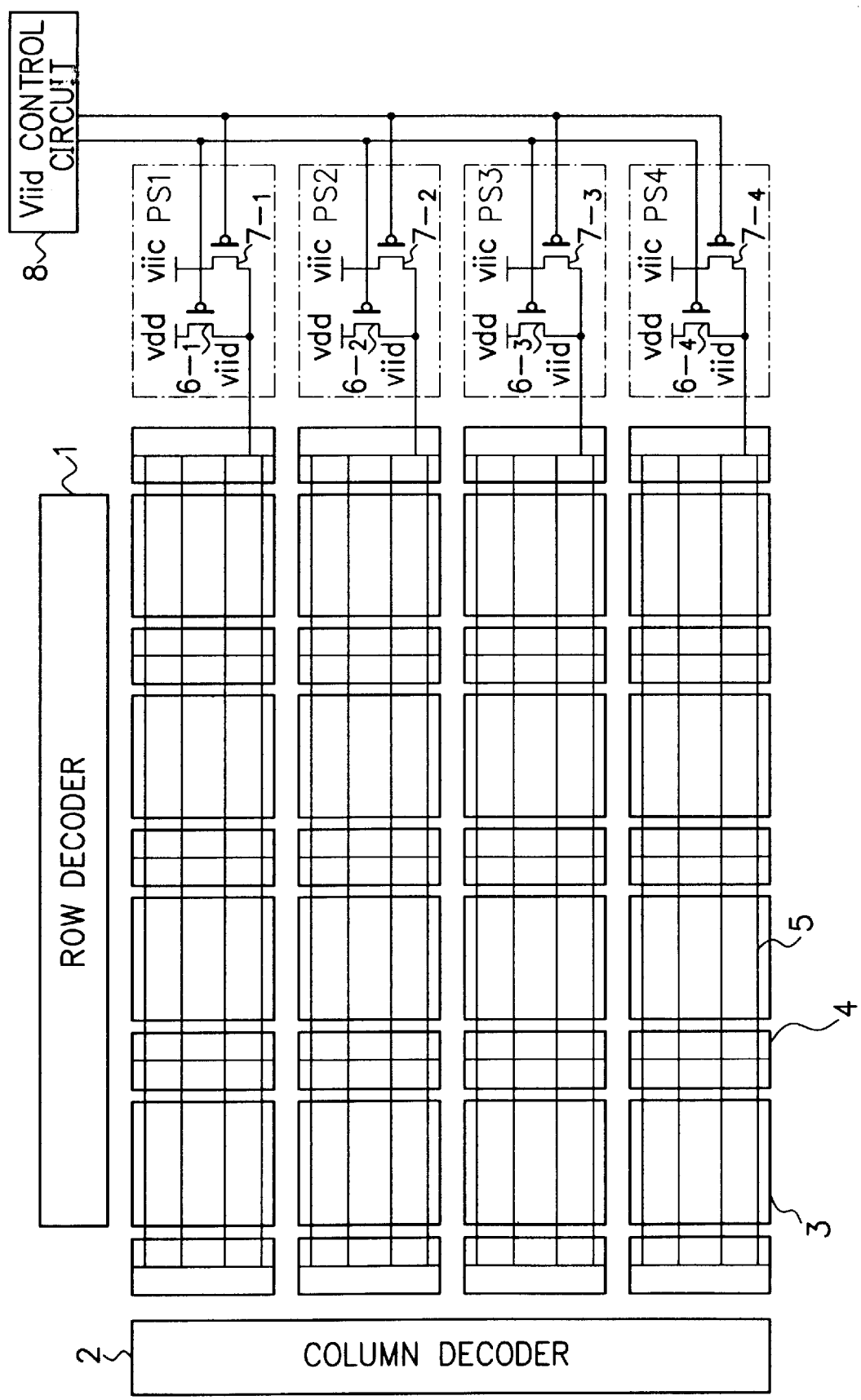
FIG. 1 is a diagram showing the structure of one memory block (bank) of a semiconductor memory device according to an embodiment of the present invention.
Figure 6:
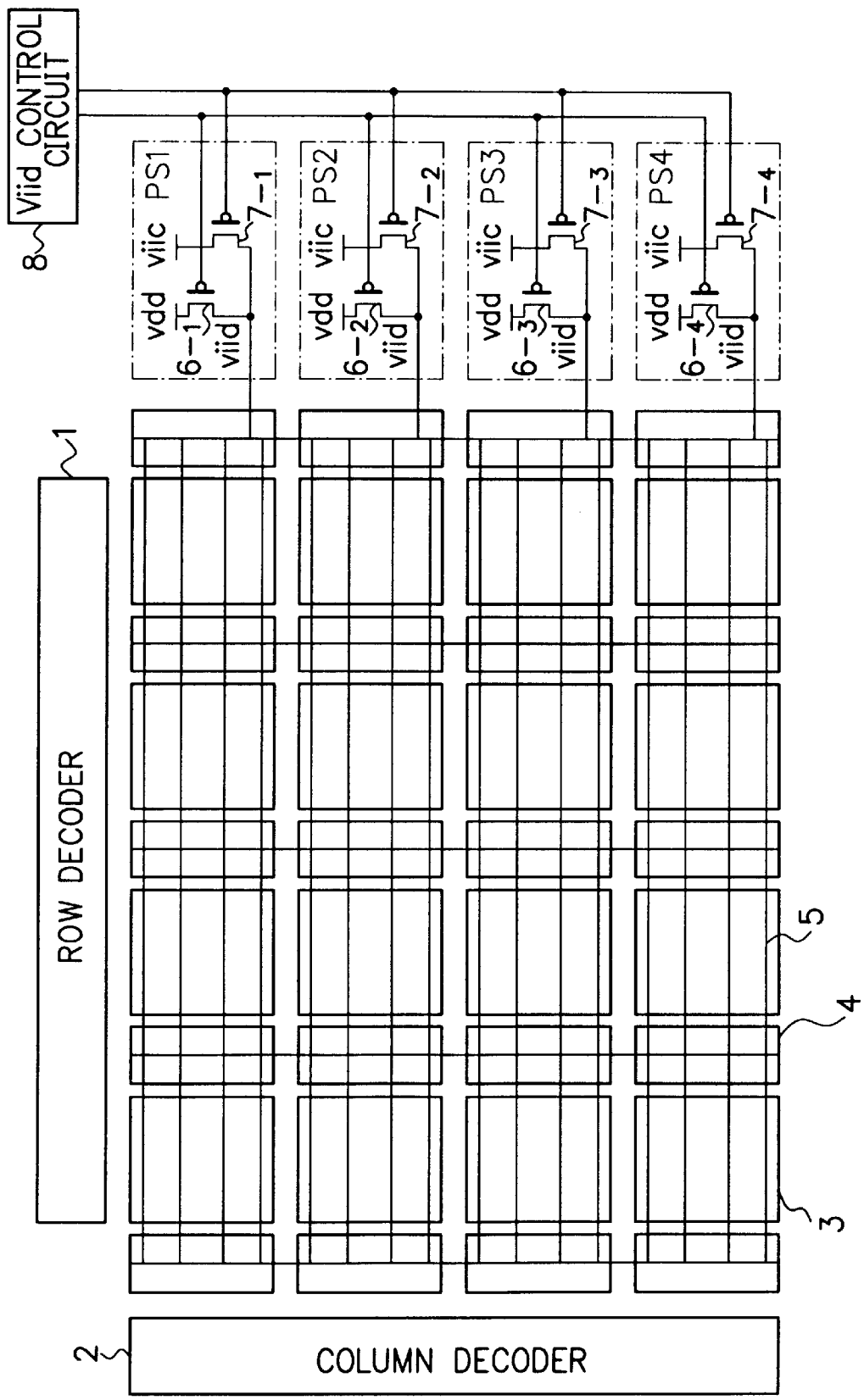
FIG. 6 is a diagram showing the construction of one memory block (bank) of a conventional semiconductor memory device.
Figure 7:
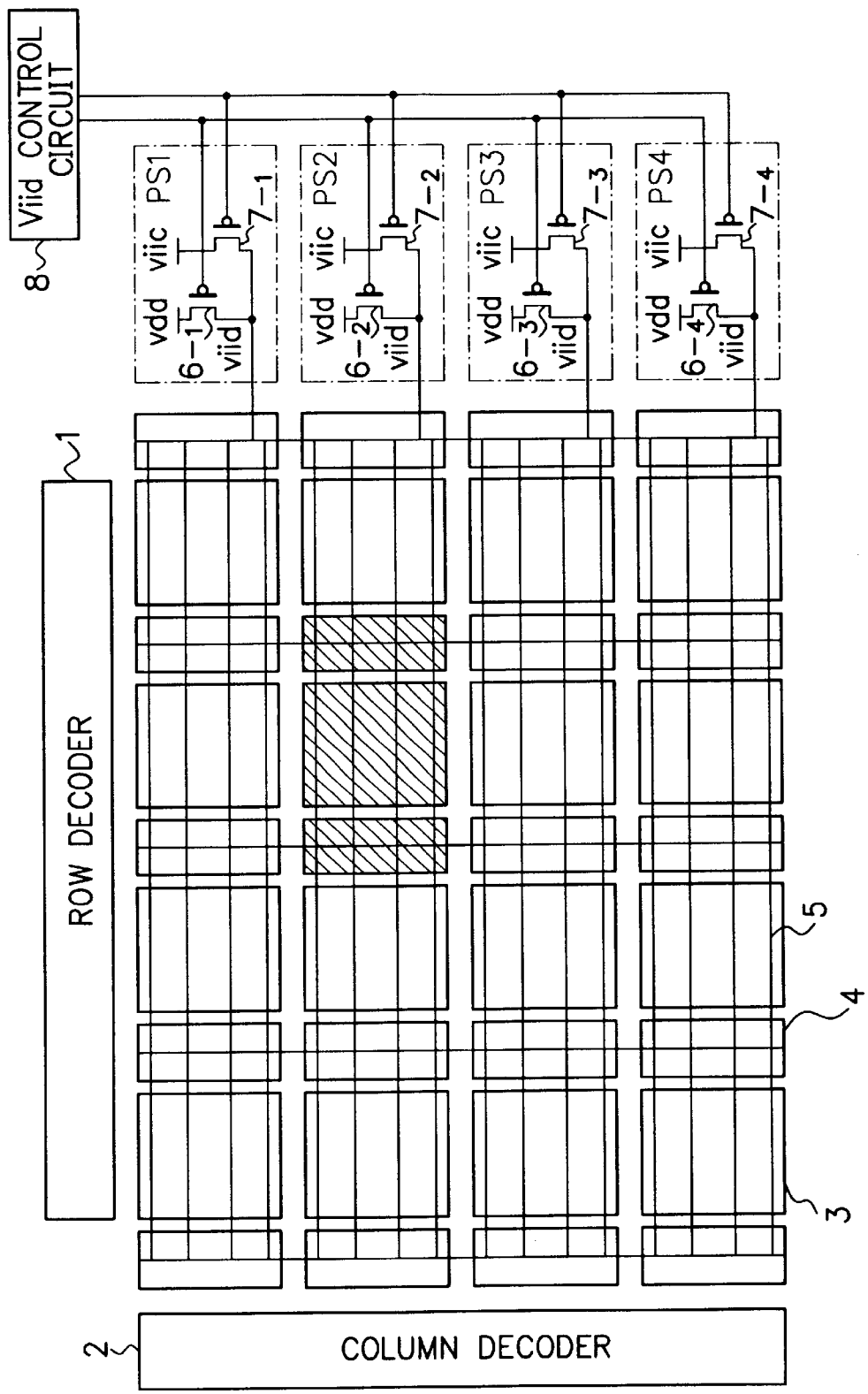
FIG. 7 is a diagram showing a condition in a data read/write operation in the conventional semiconductor memory device.
Figure 8:
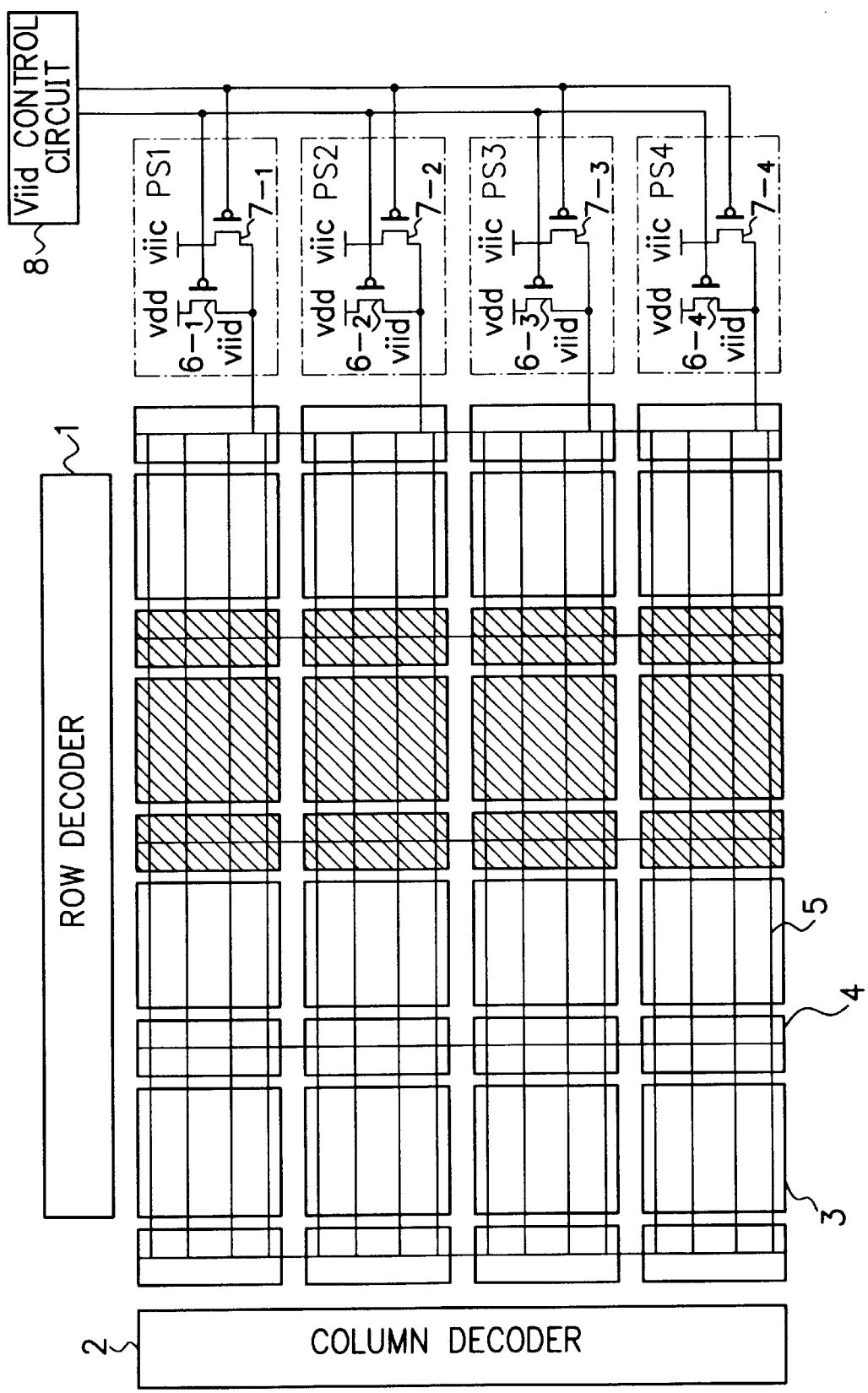
FIG. 8 is a diagram showing a condition in a refreshing operation in the conventional semiconductor memory device.

FIG. 1 is a diagram showing the construction of one memory block (bank) of a semiconductor memory device according to an embodiment of the present invention. In FIG. 1, the same reference numerals as those in FIG. 6 to FIG. 8 denote the same components as those in FIG. 6 to FIG. 8, respectively. The semiconductor memory device shown in FIG. 1 is applied to a DRAM, for example, an FCRAM of a high speed cycle type.

In the FCRAM according to this embodiment, it is assumed that one bank in which, for example, 16 memory cell arrays (sub-blocks) 3 are arranged in a matrix state as shown in FIG. 1 is divided into four groups by the row which each of four power supply circuit PS1 to PS4 belongs to. Further, power supply wirings for sense amplifiers (Viid) 5 are not connected between each group, but connected in each group separately.

Namely, an area of a column in which the sense amplifiers 4 are activated in the reading-out/writing-in of data is regarded as one group in this embodiment. The power supply wirings for the sense amplifiers (Viid) 5 are connected in a mesh state to the respective groups in the bank, and the power supply wirings for the sense amplifiers (Viid) 5 are not connected between the adjacent groups. Further, a predetermined number (one, for example) of power supply circuit PS1 to PS2 is connected to each group.

Figure 2:
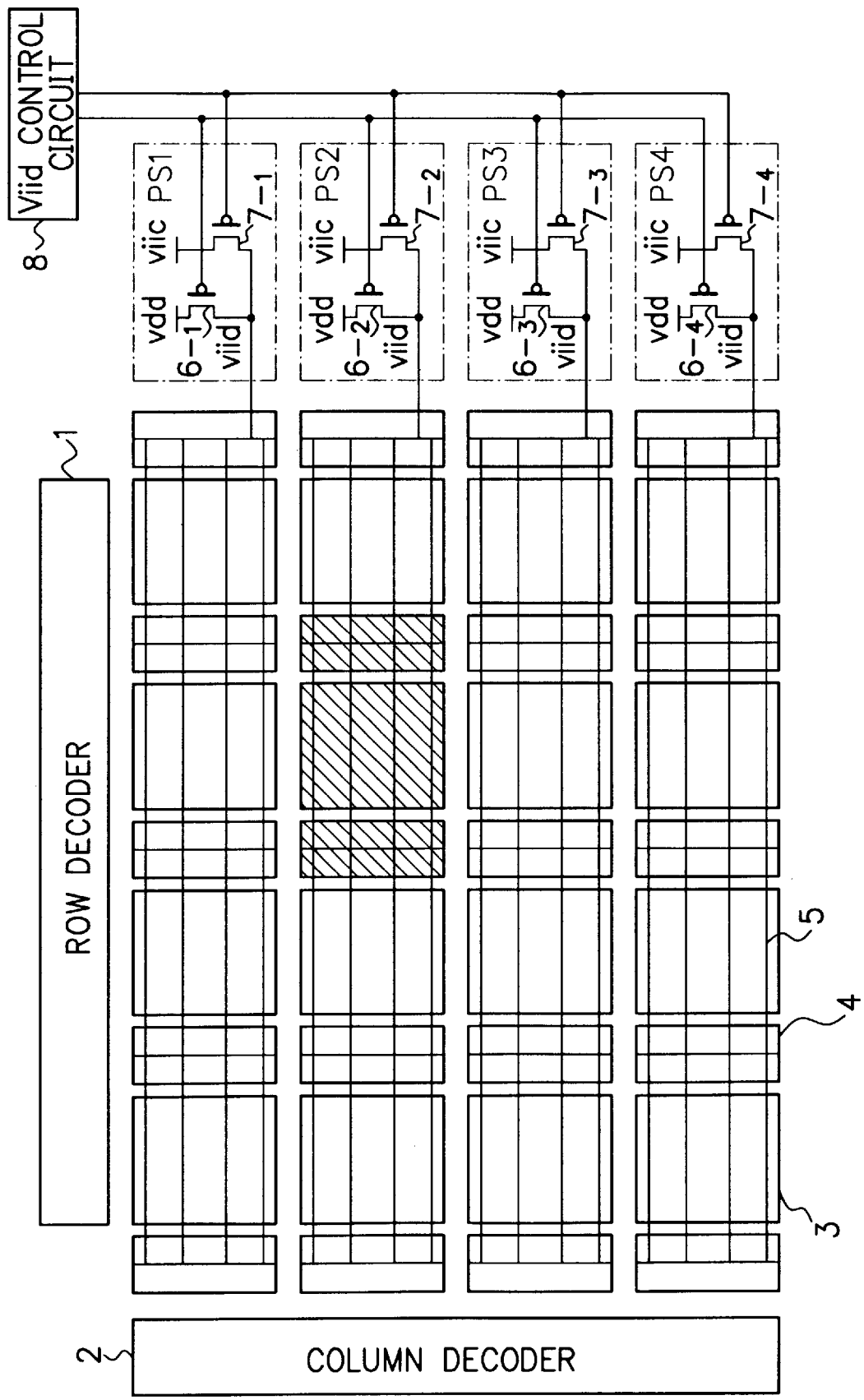
FIG. 2 is a diagram showing a condition in a data read/write operation in the semiconductor memory device according to the embodiment.
Figure 3:
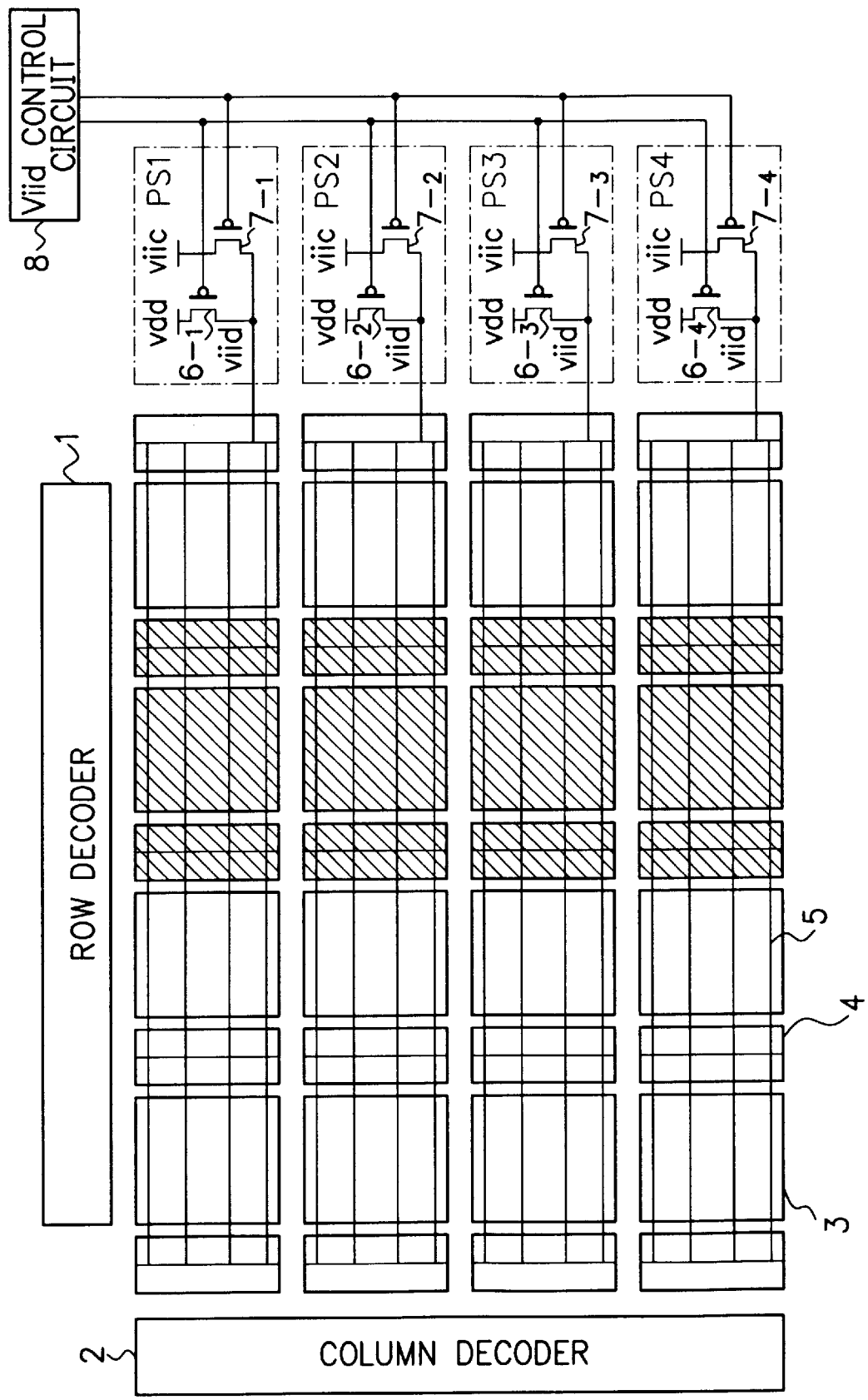
FIG. 3 is a diagram showing a condition in a refreshing operation in the semiconductor memory device according to the embodiment.

FIG. 2 and FIG. 3 are diagrams showing the states of the FCRAM in the reading-out/writing-in operations and a refreshing operation according to this embodiment. As shown in FIG. 2, in the reading-out/writing-in of data, only the selected sub-block 3 and the sense amplifiers 4 on both sides thereof are activated. In this case, the power supply wirings for the sense amplifiers (Viid) 5 are connected separately by the group so that a power supply voltage is supplied to the activated sense amplifiers 4 only from one power supply circuit PS2 which is connected to the group including the sense amplifiers 4.

Meanwhile, as shown in FIG. 3, in the refreshing operation, four sub-blocks 3 which are in a row selected by a row decoder 1 and the sense amplifiers 4 on these both sides are activated. In this case, the power supply wirings for the sense amplifiers (Viid) 5 are connected separately by the group so that the power supply voltage is separately supplied from the power supply circuits PS1 to PS4 which are connected to the groups including the sense amplifiers 4 to the activated sense amplifiers 4 in each of the groups.

That is, the power supply voltage is supplied to the activated sense amplifiers 4 which are included in the uppermost group only from one power supply circuit PS1 connected to the group. Further, the power supply voltage is supplied to the activated sense amplifiers 4 which are included in the second group only from one power supply circuit PS2 connected to the group. The power supply voltage is respectively supplied to the sense amplifiers 4 which are included in the third and the fourth groups only from the power supply circuits PS3 and PS4 which are connected to these groups.

Thereby, loads of the activated sense amplifiers 4 in the reading-out/writing-in of data and the refreshing can be equalized seen from the power supply circuits PS1 to PS4, which makes it possible to decrease the difference of the loads. Therefore, without providing a complex circuit which adjusts an overdrive time tovd between the reading-out/writing-in and the refreshing, it is made possible to realize appropriate overdrive of the sense amplifier 4 in the activated area in the reading-out/writing-in of data and the refreshing, respectively.

As described above, since the power supply wirings for the sense amplifiers (Viid) 5 are connected separately by the group, the four power supply circuits PS1 to PS4 may be operated concurrently in both cases of the reading-out/writing-in of data and the refreshing as is conventional, but the non-activated area is also driven wastefully in the reading-out/writing-in of data, which causes a significant loss. Therefore, it is preferable to operate only one power supply circuit which is connected to the group to which the activated area belongs.

Figure 4:
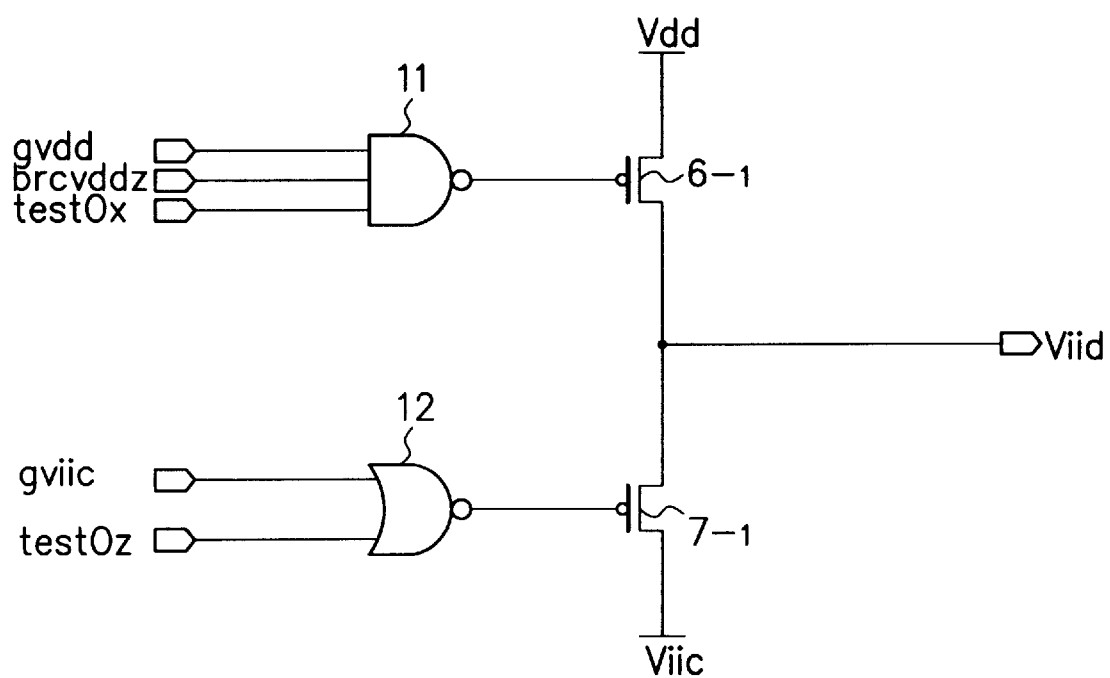
FIG. 4 is a circuit diagram showing an example of construction of a power supply selecting section according to the embodiment.
Figure 5A:
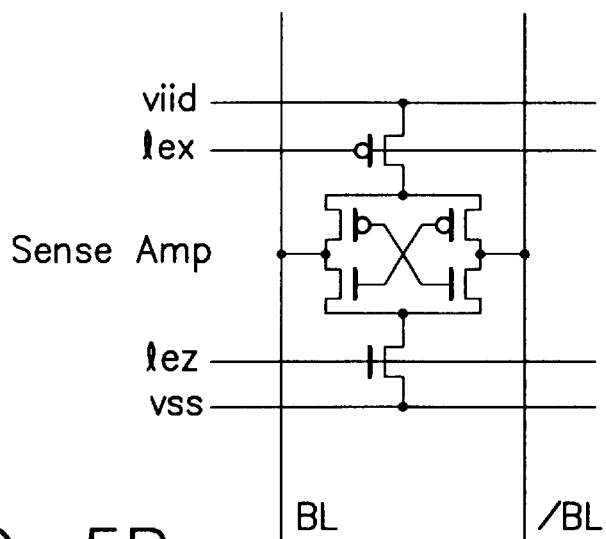
FIG. 5A to FIG. 5E are illustrations showing a general example of partial construction of a overdrive type sense amplifier and its operations.
Figure 5B:
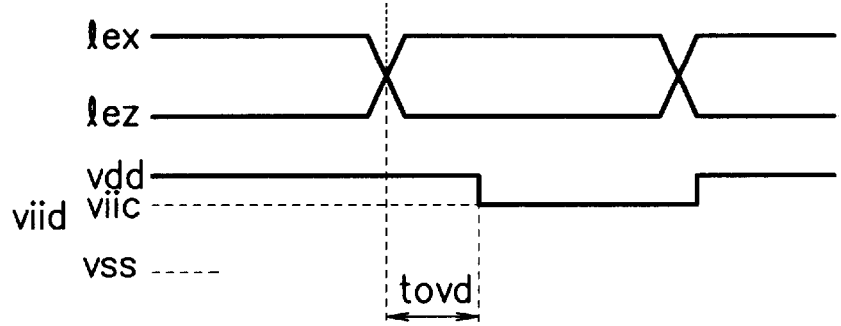
Figure 5C:
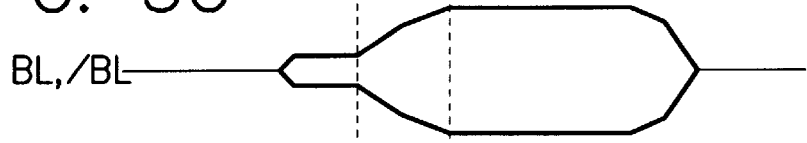
Figure 5D:
Figure 5E:

FIG. 4 is a circuit diagram showing an example of construction of a power supply selecting section which selects the power supply circuit to be activated. The power supply selecting sections in the structure as shown in FIG. 4 are provided to the respective power supply circuits PS1 to PS4. Here, the structure of the power supply selecting section which is provided to the first power supply circuit PS1 is shown and the same numerals are used to designate the same components as those in FIG. 1 to FIG. 3.

In FIG. 4, a first overdrive sense amplifier controlling signal gvdd is a signal for controlling the time in which the power supply of the sense amplifier 4 is overdriven to a high-level external voltage Vdd. A second overdrive sense amplifier controlling signal gviic is a signal for controlling the time in which the power supply of the sense amplifier 4 is held in an internal step-down voltage Viic. Test mode controlling signals test0x, test0z are the signals used in testing.

Further, an overdrive sense amplifier block selecting signal brcvddz is a signal for selecting the block (group) in which the sense amplifiers 4 are operated. In the reading-out/writing-in of data, only the overdrive sense amplifier block selecting signal brcvddz to any one of the power supply selecting sections is activated among the four power supply selecting sections which are provided corresponding to the four power supply circuits PS1 to PS4. This is controlled based on a column address signal which selects the area to be activated. Meanwhile, in the refreshing, all the overdrive sense amplifier block selecting signals brcvddz which are provided to the four power supply selecting sections are activated.

All of these signals, gvdd, gviic, test0x, test0z, and brcvddz are the signals of negative logic, and are supplied from a Viid control circuit 8. Among these, the first overdrive sense amplifier controlling signal gvdd, the test mode controlling signal test0x and the overdrive sense amplifier block selecting signal brcvddz are supplied to a NAND (non-conjunction) circuit 11. An output signal of the NAND circuit 11 is connected to a gate of a pMOS transistor $6_{-1}$ and the pMOS transistor $6_{-1}$ is turned on when all three input signals to the aforesaid NAND circuit 11 are activated so that the external voltage Vdd is supplied to the power supply wiring for the sense amplifier (Viid) 5.

Further, the second overdrive sense amplifier controlling signal gviic and the test mode controlling signal test0z are supplied to a NOR (non-disjunction) circuit 12. An output signal of the NOR circuit 12 is connected to a gate of a pMOS transistor $7_{-1}$ and the pMOS transistor $7_{-1}$ is turned on when at least one of these input signals to the aforesaid NOR circuit 12 is activated so that the internal step-down voltage Viic is supplied to the power supply wiring for the sense amplifier (Viid) 5.

By providing the power supply selecting section as shown in FIG. 4, only one power supply circuit connected to the group to which the activated area belongs is operated among the four power supply circuits PS1 to PS4 in the reading-out/writing-in of data, while all the four power supply circuits PS1 to PS4 can be operated in the refreshing.

As described above, the sense amplifiers provided in the same bank are divided into the groups, the sense amplifiers in each group are connected to a common power supply line which is independent by the group, and the power supply line of each group is connected to the power supply circuit which is independent so that the loads of the sense amplifiers can be equalized between a first operation mode in which at least one sense amplifier is activated in the bank and a second operation mode in which the increased number of sense amplifiers are activated in the bank than in the first operation mode, which makes it possible, for example, to control overdrive easier. Thereby, without providing a special controlling circuit, it is possible to prevent the insufficiency/excess of the driving capacity of overdrive, and to achieve the speeding up of the semiconductor memory device.

Please note that the aforesaid embodiment shows the concrete example for carrying out the present invention, and the technical range of the present invention is not intended to be interpreted in a narrow sense thereby. Therefore, the present invention may be carried out in various forms without departing from the spirit and the main features thereof.

For example, in the aforesaid embodiment, overdrive is used only for the pMOS transistor, but it can be used for an nMOS (n channel MOS) transistor as well.

Moreover, the semiconductor memory device of this embodiment can be applied to the DRAM other than the FCRAM as long as the memory operates overdrive. Further, it is not limited to overdrive and if the memory has the function of supplying the power supply voltage by switching, it can be applied to the memory like this.

What is claimed is:

1. A semiconductor memory device comprising:
a memory cell block including a plurality of sub memory cell blocks in a row direction;
a plurality of sense amplifier blocks arranged in the row direction, each amplifying data stored in corresponding one of the sub memory cell blocks;
a plurality of sense amplifier driver circuits, each exclusively driving corresponding one of the sense amplifier blocks; and
a plurality of sets of sense amplifier power supply lines, each set exclusively supplying corresponding one of the sense amplifier blocks with power from corresponding one of the sense amplifier driver circuits, and one set of the sense amplifier power supply lines being electrically isolated with the other sets,
wherein the number of the activated sub memory cell blocks is different in response to operation modes.

2. A semiconductor memory device comprising,
sense amplifiers in a bank for amplifying bit line voltages,
said amplifiers being divided into groups, the amplifiers in each group being connected to a common power supply line independent of those of the other groups, said line being connected to a power supply circuit independent of those of the other groups,
wherein the power supply operation of said power supply circuit includes a first stage for supplying a power supply voltage to a sense amplifier in the corresponding group to activate said amplifier, and a second stage for supplying a second power supply voltage to said amplifier to activate said amplifier.

3. The device according to claim 2, wherein said power supply circuit is for overdriving said sense amplifier.

4. A semiconductor memory device comprising
sense amplifiers in a bank for amplifying bit line voltages,
said amplifiers being divided into groups, the amplifiers in each group being connected to a common power supply line independent of those of the other groups, said line being connected to a power supply circuit independent of those of the other groups;
wherein said device has a first operation mode in which at least one sense amplifier in said bank is activated, and a second operation mode in which the greater number of sense amplifiers in said bank than that in said first operation mode are activated.

5. A semiconductor memory device comprising,
sense amplifiers in a bank for amplifyingbit line voltages,
said amplifiers being divided into groups, the amplifiers in each group being connected to a common power supply line independent of those of the other groups, said line being connected to a power supply circuit independent of those of the other groups, wherein said device has a first operation mode in which at least one sense amplifier in said bank is activated, and a second operation mode in which the greater number of sense amplifiers in said bank than that in said first operation mode are activated,
a power supply selecting section for selecting a power supply circuit to be driven in each of said first and second operation modes, wherein the power supply operation of said power supply circuit includes a first stage for supplying a power supply voltage to a sense amplifier in the corresponding group to activate said amplifier, and a second stage for supplying a second power supply voltage to said amplifier to activate said amplifier.

6. The device according to claim 5, wherein said first operation mode is for a data read/write operation, and said second operation mode is for a refreshing operation.

7. The device according to claim 6, further comprising a memory block for a DRAM.

8. The device according to claim 7, further comprising a row decoder and a column decoder.

9. The device according to claim 7, wherein said memory block is divided into sub-blocks.

10. The device according to claim 2, wherein said first and second stages are switched over from one to the other with a p-channel MOS transistor.

11. The semiconductor memory device according to claim 1, wherein said sense amplifier driver circuits applies the sense amplifier blocks with a first power supply voltage and applies a second power supply voltage, that is higher than the first power supply voltage, when the sense amplifier blocks initiate to operate.

12. The semiconductor memory device according to claim 11, wherein one of said operation modes is a data read or write operation, and the other of said operation modes is a refresh operation.

* * * * *